US008995496B2

(12) United States Patent
Le-Gall

(10) Patent No.: US 8,995,496 B2
(45) Date of Patent: Mar. 31, 2015

(54) METHOD AND DEVICE FOR ESTIMATING PARAMETERS OF A SYSTEM FOR SPREADING THE SPECTRUM OF A CLOCK SIGNAL

(75) Inventor: Hervé Le-Gall, Saint Martin d'Uriage (FR)

(73) Assignee: STMicroelectronics SAS, Grenoble (FR)

( * ) Notice: Subject to any disclaimer, the term of this patent is extended or adjusted under 35 U.S.C. 154(b) by 1023 days.

(21) Appl. No.: 13/085,341

(22) Filed: Apr. 12, 2011

(65) Prior Publication Data

US 2011/0249702 A1 Oct. 13, 2011

Related U.S. Application Data

(63) Continuation of application No. PCT/EP2009/062586, filed on Sep. 29, 2009.

(30) Foreign Application Priority Data

Oct. 13, 2008 (FR) ...................................... 08 56914

(51) Int. Cl.
*H04B 1/00* (2006.01)
*H03K 5/19* (2006.01)
(52) U.S. Cl.
CPC ...................................... *H03K 5/19* (2013.01)
USPC ........... 375/130; 327/158; 702/106; 702/112; 702/189

(58) Field of Classification Search
CPC ....................................................... H03K 5/19
USPC ............ 375/130; 327/158; 702/189, 112, 106
See application file for complete search history.

(56) References Cited

U.S. PATENT DOCUMENTS

| 7,437,590 B2 * | 10/2008 | Decker et al. ................. 713/500 |
| 8,160,117 B1 * | 4/2012 | Courcy ......................... 375/130 |
| 2004/0076221 A1 * | 4/2004 | Refaeli et al. ................. 375/130 |
| 2005/0071132 A1 | 3/2005 | Liu ............................... 702/189 |
| 2006/0076997 A1 * | 4/2006 | Ogasawara ................... 327/291 |
| 2006/0098714 A1 * | 5/2006 | Shin et al. ..................... 375/130 |

FOREIGN PATENT DOCUMENTS

EP 1 841 066 A1 10/2007

* cited by examiner

*Primary Examiner* — Freshteh N Agndam
(74) *Attorney, Agent, or Firm* — Seed IP Law Group PLLC

(57) ABSTRACT

A method to estimate parameters of a system to spread a spectrum of a first periodic signal according to a modulation period. An embodiment comprises sampling the first signal using a second periodic signal, determining based on the sampling result each occurrence where the first and second signals are synchronous, incrementing a first counter at each sampling, the first counter being reset at each said occurrence, storing at each said occurrence the last value of the first counter before the resetting, providing a third periodic signal at a first level when said last value is greater than a threshold and at a second level when said last value is smaller than the threshold, and determining the modulation period based on the period of the third signal.

26 Claims, 10 Drawing Sheets

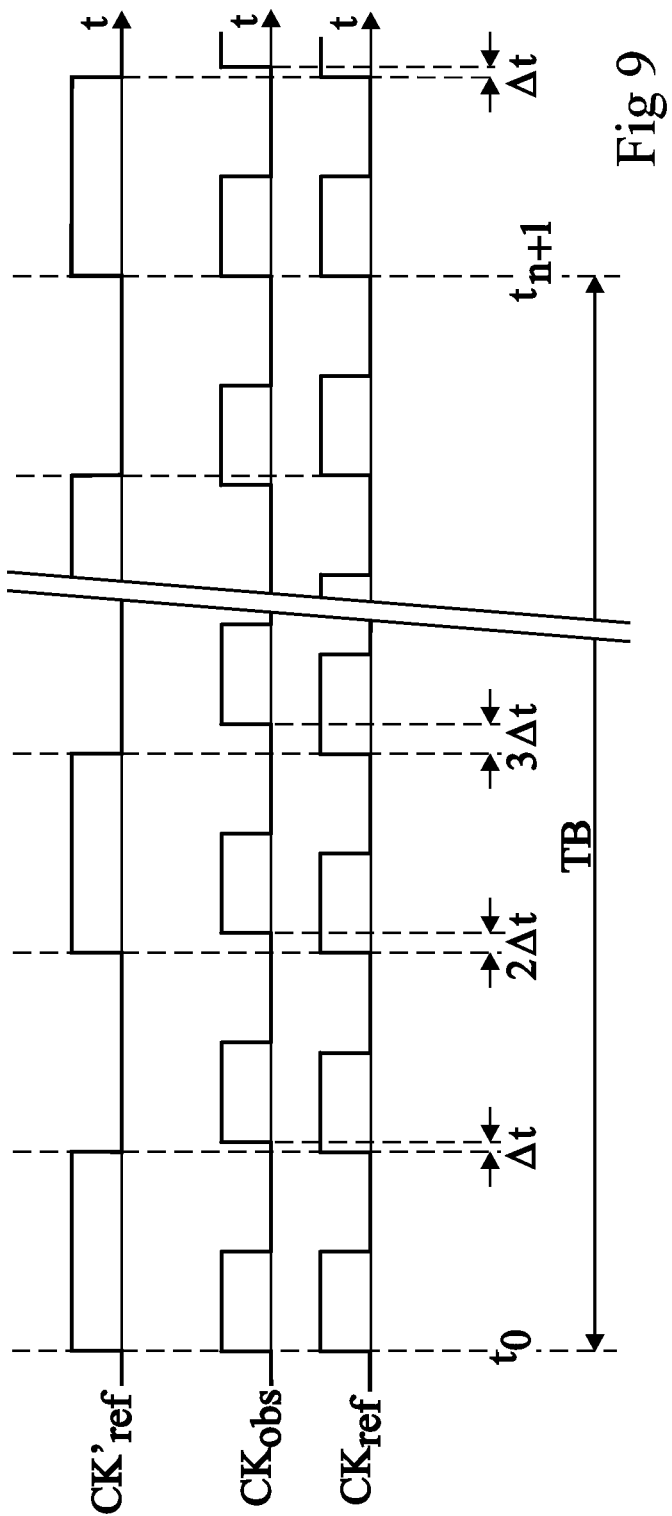

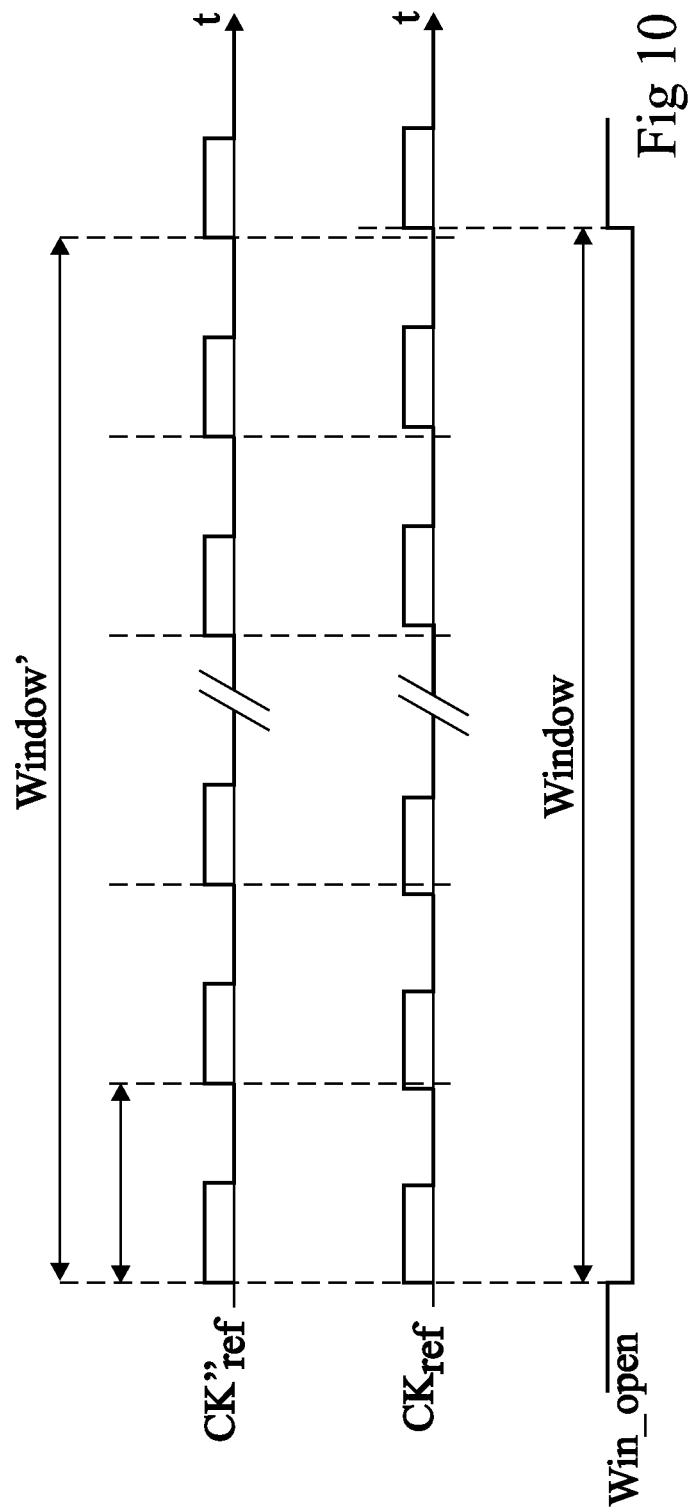

METHOD AND DEVICE FOR ESTIMATING PARAMETERS OF A SYSTEM FOR SPREADING THE SPECTRUM OF A CLOCK SIGNAL

BACKGROUND

1. Technical Field

The present disclosure generally relates to electronic circuits and, more specifically, to circuits comprising elements for generating one or several periodic signals implementing a method for spreading the spectrum of the radiation of the periodic signal(s). The present disclosure more specifically relates to the estimating of the parameters of a method for spreading the spectrum of periodic signals.

2. Description of the Related Art

Synchronous electronic circuits are generally clocked by at least one clock signal. In operation, such circuits may emit an electromagnetic radiation having a spectrum which comprises a main line at the frequency of the clock signal and secondary lines at the harmonics. The spectral line at the frequency of the clock signal concentrates most of the radiated power. This may result in electromagnetic interferences with adjacent electronic circuits. Such is the case, for example, for electronic circuits comprising high-speed series connections which may emit a radiation disturbing adjacent circuits.

To decrease the power of the main line of the radiation emitted by a synchronous electronic circuit, a possibility is to slightly vary the frequency of the clock signal along time to spread the spectrum of the emitted electromagnetic radiation. Such a method for spreading the spectrum of the clock signal, better known as Spread Spectrum Clocking, will be called SSC method hereafter.

An SSC method generally comprises carrying out a modulation of the frequency of the clock signal or SSC modulation. Most often, the clock frequency is modulated by a periodic triangular signal defined by two parameters: modulation period $T_{mod}$ and modulation ratio $R_{mod}$. Ratio $R_{mod}$ is generally defined as being the ratio of half the difference between the maximum clock frequency and the minimum clock frequency to a reference frequency, for example, the average frequency of the clock signal.

A difficulty is to estimate the parameters of an SSC method implemented by an electronic circuit. Indeed, while it is relatively easy to acknowledge the absence of implementation of an SSC by spectral analysis of the radiation emitted by an electronic circuit, it is more difficult to determine the parameters of the SSC method based on the analysis of the clock signal of the circuit to determine whether the SSC method actually implemented corresponds to the expected SSC method. This can generally only be performed by means of relatively complex dedicated tools, the use of which, in terms of cost and duration, cannot be envisaged to test electronic circuits manufactured at an industrial scale.

BRIEF SUMMARY

One embodiment of the present disclosure is a method for estimating the parameters of an SSC modulation used by an electronic circuit, of simple, fast, and cost-effective implementation.

One embodiment of the present disclosure is a device for estimating the parameters of an SSC modulation implemented by an electronic circuit which causes only few modifications of the electronic circuit.

One embodiment provides a method for estimating parameters of a system for spreading the spectrum of a first periodic signal according to a modulation period. The method comprises the steps of sampling the first signal by means of a second periodic signal, of determining based on the sampling result each occurrence where the first and second signals are synchronous, of incrementing a first counter at each sampling, the first counter being reset at each said occurrence, of storing at each said occurrence the last value of the first counter before resetting, of providing a third periodic signal at a first level when said last value is greater than a threshold and at a second level when said last value is smaller than the threshold, and of determining the modulation period based on the period of the third signal.

According to an embodiment, the spreading system is further defined by a modulation ratio. The method further comprises the steps of incrementing a second counter at each said occurrence, incrementing a third counter at each said occurrence according to the comparison of said last value and of the threshold, and determining the modulation ratio based on the ratio of the third and second counters.

According to an embodiment, the method further comprises the steps of determining a first time period corresponding to a determined number of cycles of the second periodic signal, determining a second time period corresponding to the determined number of cycles of a third periodic signal at the same frequency as the second periodic signal and having no jitter, and correcting the modulation period and the modulation ratio based on the ratio between the second and first time periods.

According to an embodiment, the method further comprises the steps of providing the result of the sampling to the input of a shift register triggered by the second signal, determining a first quantity corresponding to the number of bits of a current word formed from parallel outputs of the shift register in a first state and a second quantity corresponding to the number of bits of the current word in a second state, and counting the number of occurrences of an equality of the first and second quantities.

According to an embodiment, the method further comprises the steps of providing the result of the sampling to the input of a shift register triggered by the second signal, comparing at least first states and last states of a current word formed from parallel outputs of the shift register with at least one reference word, and counting the number of occurrences of the reference word.

According to an embodiment, the first and last bits of the reference word are in inverse states.

According to an embodiment, the reference word comprises first and second bits halves, each comprising a same number of bits in a first state and a same number of bits in a second state.

According to an embodiment, the number of bits of the reference word ranges between four and twelve.

An embodiment also provides a device for estimating parameters of a system for spreading the spectrum of a first periodic signal according to a modulation period. The device comprises a shift register having an input receiving the first periodic signal, sampled by a second periodic signal, a unit for determining, based on the sampling result, each occurrence where the first and second signals are synchronous, a first counter of each sampling reset at each said occurrence, a memory containing the last value of the first counter before resetting at each said occurrence, a unit for determining a third binary signal at a first level when said last value is greater than a threshold and at a second level when said last value is smaller than the threshold and a unit for determining the modulation period based on the period of the third signal.

According to an embodiment, the spreading system is further defined by a modulation ratio. The device further comprises a second counter of each said occurrence, a third counter of each said occurrence when said last value is greater or smaller than the threshold, and a unit for determining the modulation ratio based on the ratio of the third and second counters.

In an embodiment, a system comprises: means for generating a spread spectrum clock signal; and means for estimating a modulation period of the spread spectrum clock signal, the means for estimating having: means for sampling the spread spectrum clock signal using a sampling clock signal; means for tracking occurrences of synchronization between the spread spectrum clock signal and the sampling clock signal; and means for generating a binary signal based on the tracking of occurrences of synchronization. In one embodiment, the means for sampling comprises a shift register. In one embodiment, the means for tracking comprises a pattern detector. In one embodiment, the means for tracking comprises a counter. In one embodiment, the means for generating a binary signal comprises a comparator. In one embodiment, the system further comprises means for estimating a modulation ratio of the spread spectrum clock signal.

In one embodiment, a system comprises: a spread spectrum clock generator configured to generate a spread spectrum clock signal; and a modulation period estimator having: a sampler configured to sample the spread spectrum clock signal using a sampling signal; a synchronization detector configured to detect occurrences of synchronization between the spread spectrum clock signal and the sampling signal; and a modulation period detector configured to estimate a modulation period of the spread spectrum clock signal based on the detected occurrences. In one embodiment, the sampler comprises a plurality of flip-flops. In one embodiment, the synchronization detector comprises a shift register and a pattern detector. In one embodiment, the modulation period detector comprises: a sampling counter configured to count cycles of the sampling clock; a memory configured to store an output of the sampling counter; and a comparator configured to compare the stored output of the sampling counter to a threshold and generate a signal indicative of the modulation period based on the comparison. In one embodiment, the modulation period detector further comprises a counter configured to count transitions of the signal indicative of the modulation period from a low state to a high state. In one embodiment, the system further comprises: a modulation ratio estimator configured to estimate a modulation ratio of the spread spectrum clock signal. In one embodiment, the modulation ratio estimator comprises: a synchronization occurrence counter configured to count detected occurrences of synchronization; a threshold counter configured to count occurrences of the stored output of the sampling counter being less than the threshold; and a divider coupled to the synchronization occurrence counter and to the threshold counter. In one embodiment, the modulation period estimator is configured to compensate for jitter in the sampling signal.

In one embodiment, a method of estimating a modulation period of a spread spectrum clock in an electronic device comprises: sampling the spread spectrum clock signal with a sampling clock signal; tracking occurrences of synchronization between the spread spectrum clock signal and the sampling clock signal; generating a periodic signal based on the tracking of occurrences of synchronization; and estimating the modulation period based on a period of the generated period signal. In one embodiment, the method further comprises: counting occurrences of synchronization; and estimating a modulation ratio of the spread spectrum signal based on the counting of occurrences of synchronization.

The foregoing features, and advantages will be discussed in detail in the following non-limiting description of example embodiments in connection with the accompanying drawings.

BRIEF DESCRIPTION OF THE SEVERAL VIEWS OF THE DRAWINGS

The foregoing and other purposes, features, aspects and advantages will become apparent from the following detailed description of embodiments, given by way of illustration and not limitation with reference to the accompanying drawings, in which:

FIG. 9 illustrates in timing diagrams another example of a reference signal and of an observed signal to which an SSC modulation is applied; and FIG. 10 illustrates with timing diagrams the low-frequency jitter phenomenon affecting the reference signal used by the circuit of FIG. 6.

DETAILED DESCRIPTION

Figure 1:
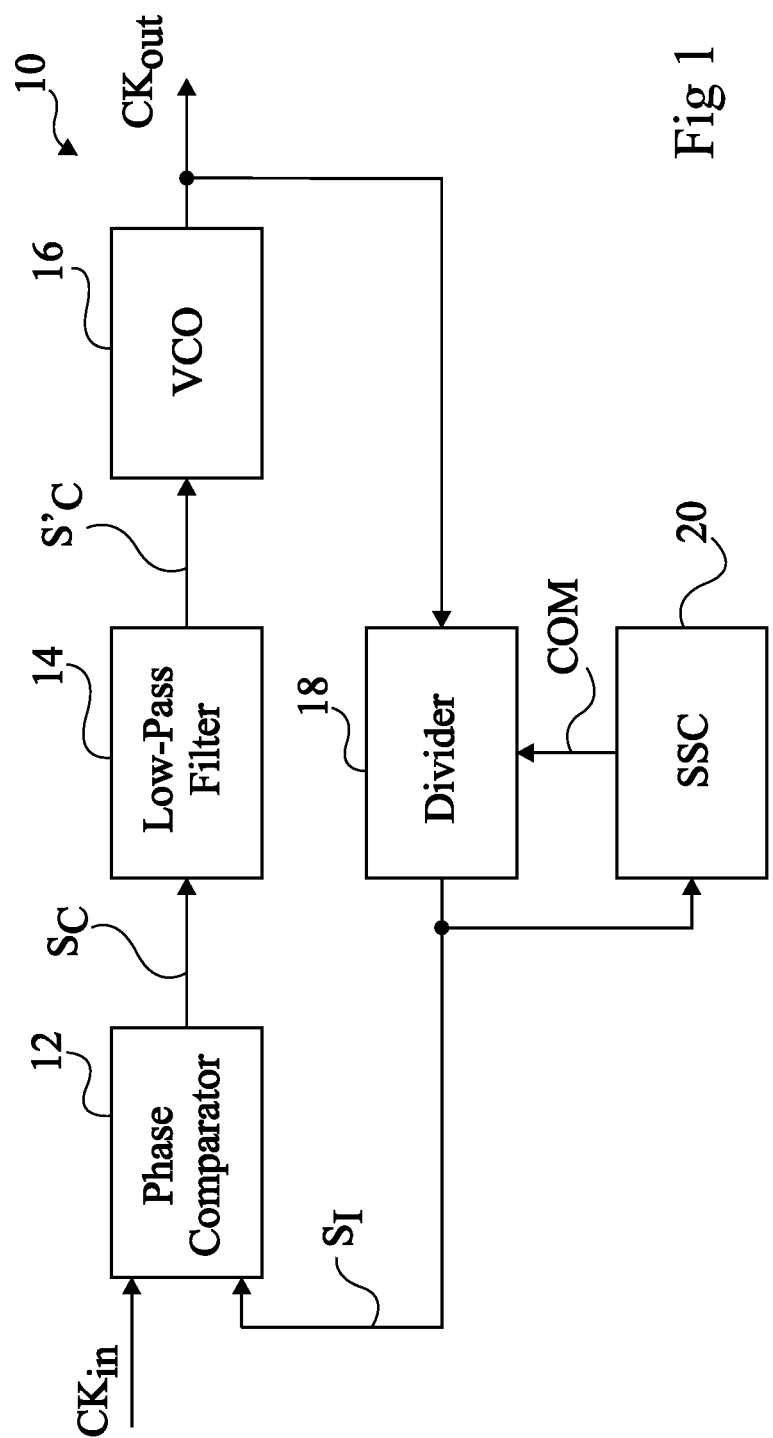
FIG. 1 schematically shows an example of a phase-locked loop implementing an SSC modulation.

For clarity, the same elements have been designated with the same reference numerals in the different drawings. Further, only those steps and elements which are useful to the understanding of the present disclosure have been shown and will be described. In particular, portions of concerned electronic circuits other than the actual circuit for estimating the SSC modulation parameters may have not been illustrated, the present disclosure being here again compatible with any conventional electronic circuit exploiting a clock signal to which an SSC modulation is applied.

FIG. 1 shows an embodiment of a circuit 10 for providing a clock signal $CK_{out}$ implementing an SSC modulation. Circuit 10 corresponds to a phase-locked loop (PLL) receiving a clock signal $CK_{in}$ and delivering clock signal $CK_{out}$ at a frequency $F_{out}$. Clock signal $CK_{in}$ is, for example, a signal provided by a piezoelectric oscillator. Circuit 10 comprises a phase comparator 12 receiving at one input clock signal $CK_{in}$ and at another input a signal $S_I$ and delivering a signal $S_C$ representative of the phase difference between signals $CK_{in}$ and $S_I$. Signal $S_C$ drives a low-pass filter 14 which provides, from a signal $S_C$, a control signal $S'_C$ to a voltage-controlled oscillator 16 (VCO). Oscillator 16 delivers clock signal $CK_{out}$ at a frequency which depends on signal $S'_C$. A divider 18 receives signal $CK_{out}$ and delivers signal $S_I$, having a frequency equal to the frequency of signal $CK_{out}$ divided by a division factor M.

To spread the spectrum of clock signal $CK_{out}$, circuit 10 comprises a spread spectrum clocking circuit 20 (SSC) which provides divider 18 with a control signal COM. Spread spectrum clocking circuit 20 can receive signal $S_I$. Divider 18 is capable of modifying factor M according to signal COM. The variation of factor M translates as a modulation of frequency $F_{osc}$ of signal $CK_{out}$ around a central frequency $F_0$.

Figure 2:
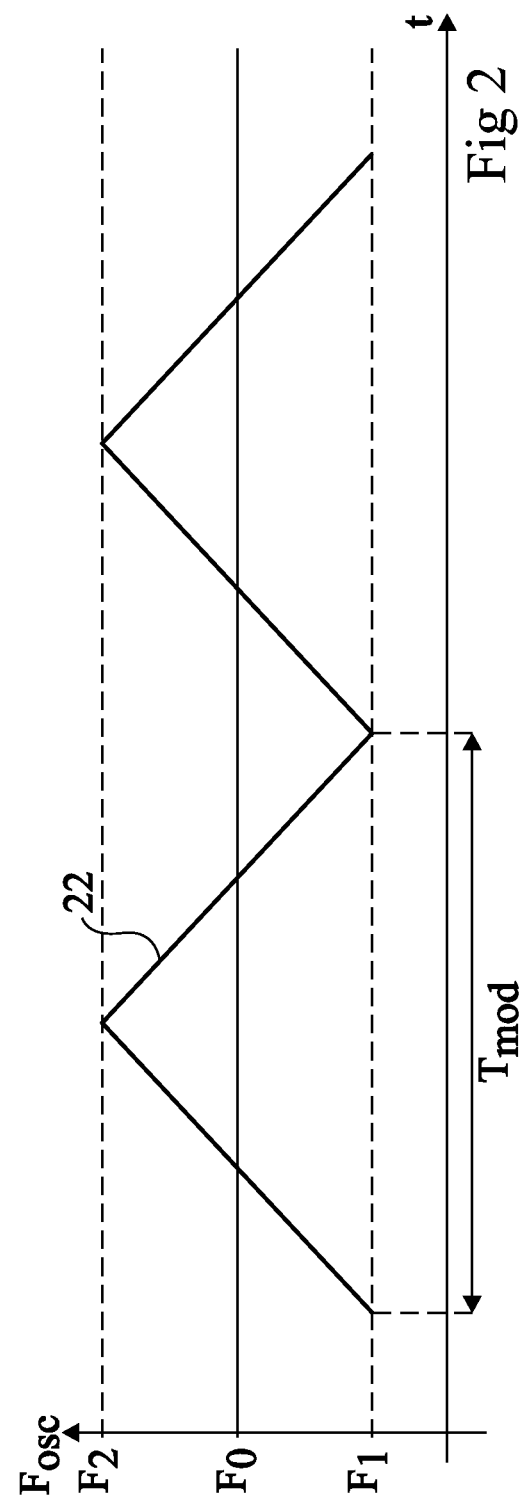
FIG. 2 shows an example of a curve of the variation of the frequency of a periodic signal to which an SSC modulation is applied.

FIG. 2 illustrates an example of a curve 22 of the variation of oscillation frequency $F_{osc}$ of signal $CK_{out}$ for an example of an SSC modulation. Frequency $F_{osc}$ varies between a minimum frequency $F_1$ and a maximum frequency $F_2$ around central frequency $F_0$ according to a periodic triangular modulation of period $T_{mod}$ (corresponding to a frequency $F_{mod}$). Call modulation ratio $R_{mod}$ the ratio of half the difference between frequencies $F_2$ and $F_1$ to central frequency $F_0$. According to another definition, modulation ratio $R_{mod}$ may correspond to the ratio of the difference between frequencies $F_2$ and $F_1$ to frequency $F_2$ or $F_1$. According to another example, the modulation may be sinusoidal. It is then also defined by modulation period $T_{mod}$ and modulation ratio $R_{mod}$.

An estimation method according to an embodiment comprises determining, based on an analysis of the clock signal to which an SSC modulation is applied, parameters $T_{mod}$ and $R_{mod}$ of the SSC modulation implemented by spread spectrum clocking circuit 20. For this purpose, the observed signal to which the SSC modulation is applied is compared with a periodic reference signal $CK_{ref}$. Periodic reference signal $CK_{ref}$ may be a signal provided by a circuit for generating a periodic signal. It is for example a clock signal directly provided by a piezoelectric oscillator, a clock signal provided by a phase-locked loop, etc.

Figure 3:
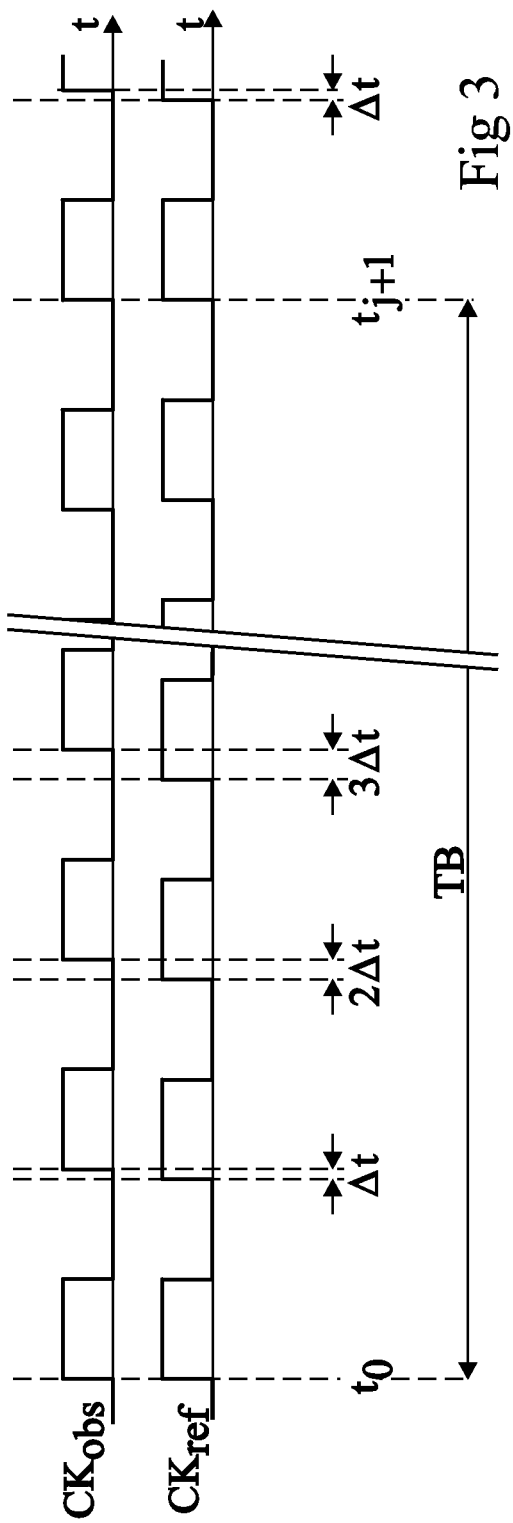
FIG. 3 illustrates in timing diagrams an example of a reference signal and of an observed signal to which an SSC modulation is applied.

FIG. 3 shows timing diagrams of an example of an observed periodic signal $CK_{obs}$ to which an SSC modulation is applied, for example, the SSC modulation of FIG. 2, and of a periodic reference signal $CK_{ref}$ of frequency $F_{ref}$ and of period $T_{ref}$. In this example, signals $CK_{obs}$ and $CK_{ref}$ are binary signals varying between two states, a high state (state "1") and a low state (state "0"). For simplification, the signal edges are assumed to be instantaneous. In practice, they follow a slope between the two high and low states and conversely. This however does not change the principles.

In the present example, it is assumed that the frequencies of signals $CK_{obs}$ and $CK_{ref}$ are close to each other and that modulation period $T_{mod}$ is much greater than the period of signal $CK_{ref}$. For illustration purposes, it is considered that frequency $F_{ref}$ is slightly greater than maximum frequency $F_2$ of signal $CK_{obs}$ to be observed. Assuming that the signals are synchronous at a time $t_0$, the phase-shift of signal $CK_{obs}$ with respect to signal $CK_{ref}$ successively substantially increases by a same value Δt at each clock period until the two signals become synchronous again at a time $t_{j+i}$, after j+1 periods of reference clock signal $CK_{ref}$, observed signal $CK_{obs}$ only having, during this elapsed time TB, j periods. Since the frequency of signal $CK_{obs}$ is modulated by an SSC modulation, duration TB is not constant but varies periodically.

An estimation method according to an embodiment uses a BCC counter which is incremented on each rising (or falling) edge of reference clock signal $CK_{ref}$ and which is reset each time signals $CK_{obs}$ and $CK_{ref}$ are synchronous. Thereby, the value of the BCC counter before resetting, called BCCm, corresponds to the number of rising (or falling) edges of reference clock signal $CK_{ref}$ in time TB.

Figure 4:
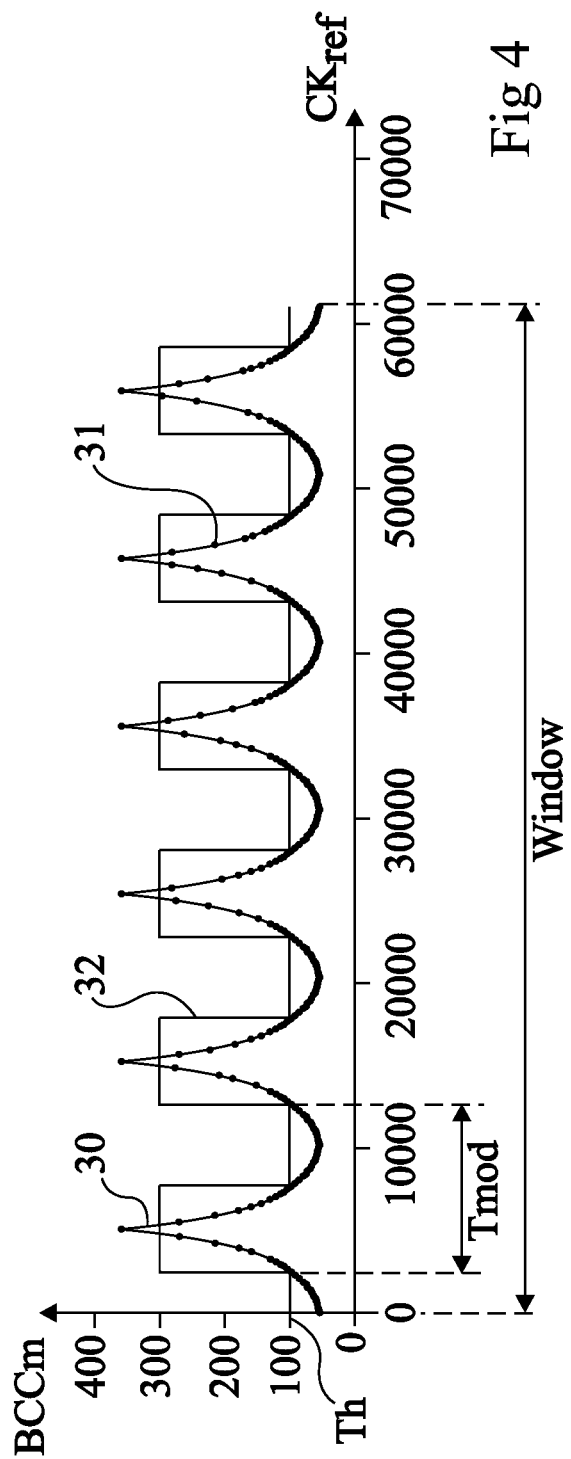
FIGS. 4 and 5 show examples of signal variation curves illustrating a method for estimating SSC modulation parameters according to an embodiment.

FIG. 4 shows an example of a curve 30 of the variation of value BCCm according to the rising edges of reference signal $CK_{ref}$ when the SSC modulation is of the type shown in FIG. 2. In the present example, frequency $F_{ref}$ of reference signal $CK_{ref}$ is slightly greater than maximum frequency $F_2$ of observed signal $CK_{obs}$. As an example, frequency $F_{ref}$ is of 607.5 MHz, central frequency $F_0$ of signal $CK_{obs}$ is 600 MHz, modulation ratio $R_{mod}$ is of 1% and modulation frequency $F_{mod}$ is 60 KHz. Curve 30 is determined on a operating time window Window and runs through points 31, each point 31 having, as an abscissa, a number of cycles of signal $CK_{ref}$ at which signals $CK_{obs}$ and $CK_{ref}$ are synchronous and, as an ordinate, value BCCm before resetting of the BCC counter. Curve 30 varies periodically at a period equal to modulation period $T_{mod}$.

To determine modulation period $T_{mod}$, the method according to an embodiment comprises comparing value BCCm with a threshold Th and providing a binary signal SSC_Detect in a first state, for example, "1", when value BCCm is greater than threshold Th, and in a second state, for example "0", when value BCCm is smaller than threshold Th. Curve 32 illustrates the variation of signal SSC_Detect obtained from curve 30 when threshold Th is equal to 100. Signal SSC_Detect is a periodic signal having a period corresponding to modulation period $T_{mod}$. Modulation period $T_{mod}$ of the SSC modulation can thus be obtained by dividing time window Window by the number of rising (or falling) edges of signal SSC_Detect which have occurred during time window Window.

To determine modulation ratio $R_{mod}$, the Applicant has shown that duty cycle CYC of signal SSC_Detect is linked to modulation ratio $R_{mod}$ by a monotonous function. Thereby, the determination of duty cycle CYC enables to obtain modulation ratio $R_{mod}$. To determine duty cycle CYC, the method according to an embodiment uses two counters BEC and BTC. Counter BEC is incremented each time a new value BCCm is obtained, that is, each time signals $CK_{obs}$ and $CK_{ref}$ are synchronous. The BTC counter is incremented each time the new value BCCm obtained is smaller than threshold Th. The ratio between the BTC and BEC counters corresponds to duty cycle CYC of signal SSC_Detect.

Figure 5:
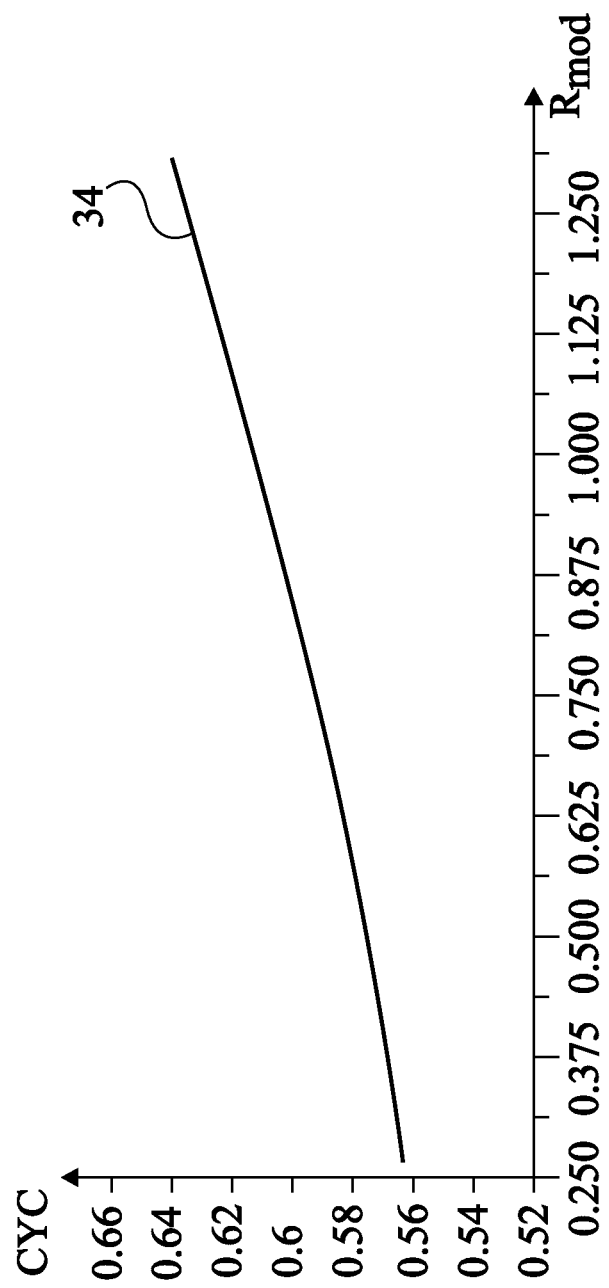

FIG. 5 shows an example of a curve 34 of the variation of ratio CYC according to modulation ratio $R_{mod}$ obtained for curve 30 and threshold Th of FIG. 4. Thereby, modulation ratio $R_{mod}$ can be obtained from ratio CYC.

Figure 6:
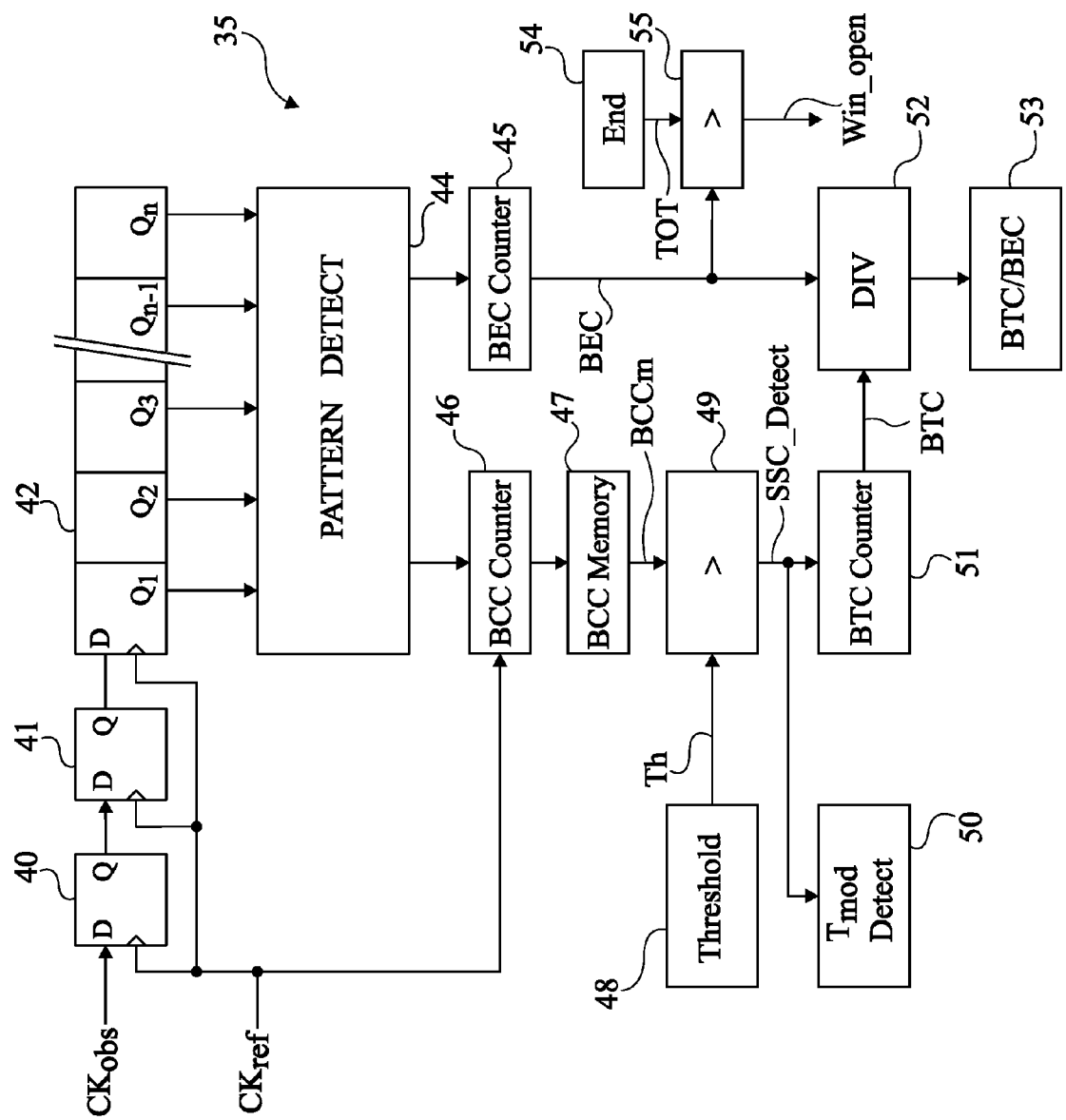
FIG. 6 schematically shows in the form of blocks an embodiment of a circuit for estimating SSC modulation parameters according to an embodiment.

FIG. 6 schematically shows in the form of blocks a testing circuit 35 according to an embodiment. Signal $CK_{obs}$ is sampled by at least one first flip-flop 40 and preferably by two flip-flops 40 and 41 in series, data input D of flip-flop 41 being connected to the Q output of flip-flop 40. Signal $CK_{ref}$ is applied on the clock inputs of flip-flops 40 and 41. A double sampling reduces the uncertainties linked to the set-up and hold times of the flip-flops and to the slopes of the edges of signals $CK_{obs}$ and $CK_{ref}$.

The result of this sampling is applied to the input of a shift register 42 formed as illustrated of D flip-flops in series having their respective outputs $Q_i$ to $Q_n$ provided in parallel to a pattern detector 44 (PATTERN DETECT). As an example, number n of bits of register 42 ranges between four and twelve. The function of the detector is to determine from bits $Q_1$ to $Q_n$ when signals $CK_{obs}$ and $CK_{ref}$ are synchronous. This may be obtained by comparing successive bit words $Q_i$ to $Q_n$ with at least one reference pattern, as will be described in further detail hereafter. Circuit 44 is connected to a BEC counter 45 and to a BCC counter 46. BCC counter 46 is incremented on each rising edge of reference clock signal $CK_{ref}$. Each time circuit 44 detects that signals $CK_{obs}$ and $CK_{ref}$ are synchronous, it resets BCC counter 46 and increments BEC counter 45. The last value BCCm before resetting is stored in a memory 47 (BCC Memory). Circuit 35 comprises a memory 48 (Threshold), for example, a register, in which the value of threshold Th is stored. Each new value BCCm is compared with threshold Th by a comparator 49. Comparator 49 delivers signal SSC_Detect. Signal SSC_Detect is, for example, set to the high state when value BCCm is greater than threshold Th and set to the low state when value BCCm is smaller than threshold Th. Circuit 35 comprises a unit 50 ($T_{mod}$ Detect) which detects when signal SSC_Detect switches from the low state to the high state (or from the high state to the low state). As an example, unit 50 comprises a counter which is incremented each time signal SSC_Detect switches from the low state to the high state. Circuit 35 comprises BTC counter 51 which is incremented for each determination of a new value BCCm, when this value is smaller than threshold Th. The values of the BTC and BEC counters are provided to a divider 52 (DIV) which determines the ratio between the BTC counter and the BEC counter, this ratio being stored in a memory 53 (BTC/BEC).

Circuit 35 comprises a memory 54 (End) in which is stored the total number TOT of cycles of reference clock signal $CK_{ref}$ during which circuit 35 operates. The BEC counter is compared with threshold TOT by a comparator 55 which provides a signal Win_open. As an example, signal Win_open is set to a first state, for example, "0", when the BEC counter is smaller than threshold TOT and set to a second state, for example "1", when the BEC counter is greater than or equal to threshold TOT.

Initially, the BCC, BEC, and BTC counters are at zero and signal Win_open is at state "0". At the first rising edge of clock signal $CK_{ref}$, signal Win_open switches to "0". Circuit 35 operates until signal Win_open switches to "1".

Modulation period $T_{mod}$ is, for example, obtained by dividing the duration of operating time window Window, that is, the duration for which signal Win_open is at "0", by the value of counter 50. Modulation ratio $R_{mod}$ is obtained from the value stored in memory 53 at the end of operating time window Window and curve 34 which may be stored in a memory of Look-up Table type, not shown.

The values of modulation period $T_{mod}$ and of modulation ratio $R_{mod}$ provided by circuit 35 may be compared with reference values. Too large an interval with respect to the reference values means that the SSC modulation applied to observed signal $CK_{obs}$ does not correspond to the expected SSC modulation.

The detection by circuit 35 of a synchronous edge between signals $CK_{obs}$ and $CK_{ref}$ may be performed by considering that the samples of signal $CK_{obs}$ which come before a synchronous edge and the samples of signal $CK_{obs}$ which follow a synchronous edge have inverse values.

An embodiment provides comparing the word contained in shift register 42, driven by reference signal $CK_{ref}$, and having its data input receiving the sampled signal to be measured $CK_{obs}$, with a reference pattern to estimate the presence of a common rising edge between signals $CK_{ref}$ and $CK_{obs}$. As an example, the reference pattern comprises an even number of bits distributed in a first bit half and a second bit half. The present embodiment provides detecting the presence of a synchronous edge between signals $CK_{ref}$ and $CK_{obs}$ which substantially occurs at half of the word contained in shift register 42. For this purpose, according to an embodiment, the bits of the first half of the reference pattern are in a same state and the bits of the second half of the reference pattern are in the inverse state.

Figure 7:
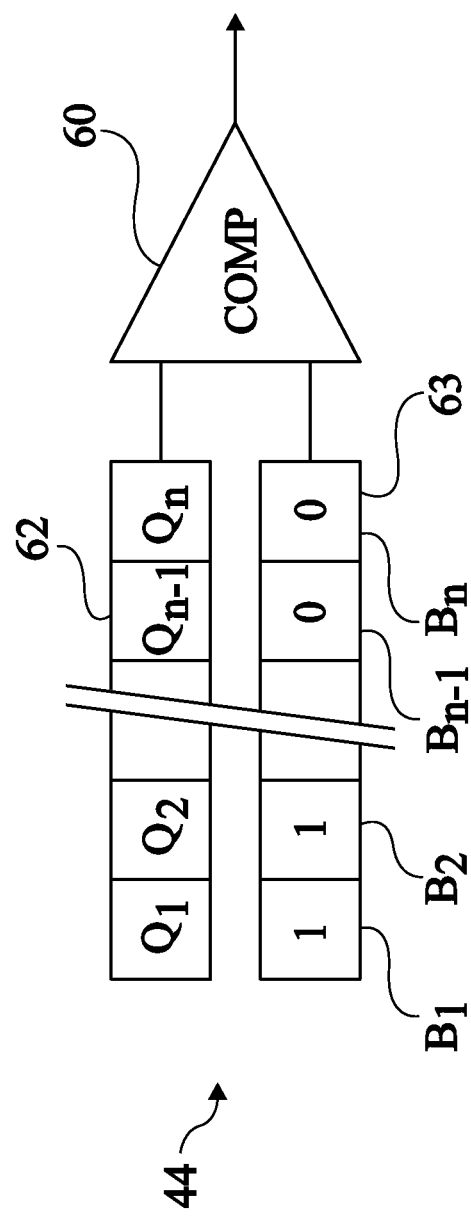
FIG. 7 schematically shows a detail of the circuit of FIG. 6.

FIG. 7 schematically shows an example of a detection circuit 44.

Functionally, this circuit comprises a comparator 60 (COMP) of word $Q_1$ to $Q_n$ provided by register 42 (possibly transiting through a temporary storage element 62) with respect to a reference word, for example stored in a storage element 63 or cabled in the circuit. According to an embodiment, first bit half $B_1$ to $B_{n/2}$ is in a first state, for example "1", and second bit half $B_{n/2+1}$ to $B_n$ is in the inverse state, for example "0". The pattern is compared with the words successively present on the outputs of shift register 42 and the frequency of its occurrence indicates the number of synchronous edges between signals $CK_{ref}$ and $CK_{obs}$.

To take into account possible fluctuations of the samples of signal $CK_{obs}$ around the synchronous edge, for example due to sampling inaccuracies, several reference patterns may be successively compared with the word contained in shift register 42, which differ from one another by the bits located in the median portion of the reference pattern, considering that the number of bits in the same state in the first half of the word contained in shift register 42 is equal to the number of bits of the inverse state in the second half of the word contained in shift register 42, to conclude that a synchronous edge is present.

Figure 8:
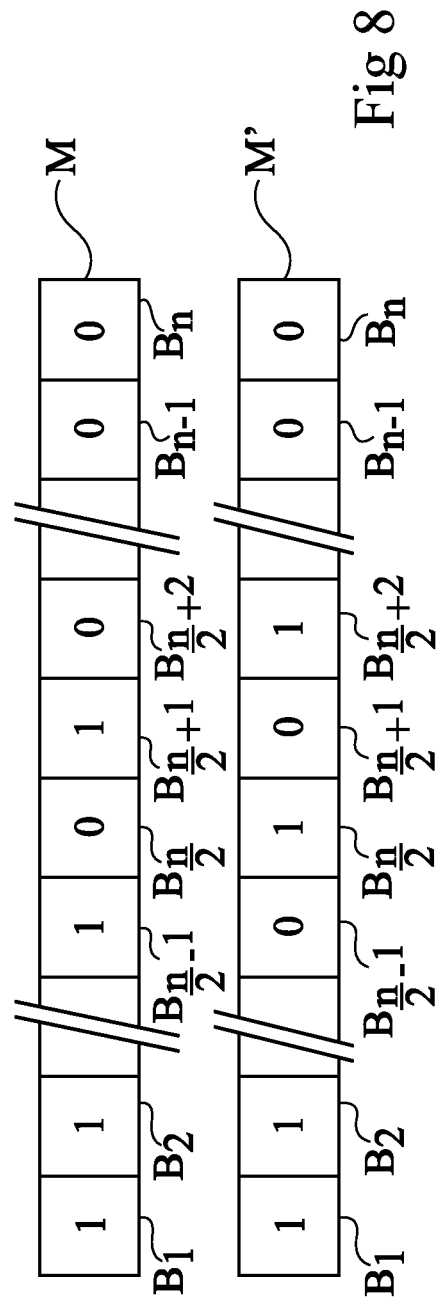
FIG. 8 shows examples of patterns used by the circuit of FIG. 7.

FIG. 8 illustrates examples of reference patterns that may be used by comparator 60 to take into account fluctuations of signal $CK_{obs}$. As an example, for pattern M, bits $B_1$ to $B_{n/2-1}$ are at "1" and bits $B_{n/2+2}$ to $B_n$ are at "0". Bit $B_n/2$ is at "0" and bit $B_{/2+1}$ is at "1". For pattern M', bits $B_1$ to $B_{n/2-2}$ are at "1" and bits $B_{n/2+3}$ to $B_n$ are at "0". Bits $B_{n/2-1}$ and $B_{n/2+1}$ are at "0" and bits $B_{n/2}$ and $B_{n/2+2}$ are at "1".

According to another embodiment, to estimate the presence of a common rising or falling edge between signals $CK_{ref}$ and $CK_{obs}$, detection circuit 44 counts the number of bits at "0" and the number of bits at "1" of the word contained in shift register 42. Signals $CK_{ref}$ and $CK_{obs}$ are considered to be synchronous in the case where the number of bits at "0" is equal to the number of bits at "1".

In the previously-described embodiment, reference signal $CK_{ref}$ has been considered to be approximately selected with a frequency on the same order of magnitude as signal $CK_{obs}$ to be observed.

FIG. 9 is a drawing similar to FIG. 3 in which a reference signal $CK'_{ref}$ having a frequency $F'_{ref}$ smaller than frequency $F_{ref}$ of signal $CK_{ref}$ by a factor K equal to 2 has further been shown. More generally, factor K may be a real number greater than or equal to 2. When signal $CK'_{ref}$ is used, the operation of test circuit 35 is identical to what has been previously described. However, as compared with the embodiment previously described in relation with FIG. 4, the obtained values BCCm are divided by factor K, given that signal $CK_{obs}$ to be observed is sampled less often.

The measurements performed by the previously-described test method may be influenced by the jitter which affects reference clock signal $CK_{ref}$. Thereby, modulation period $T_{mod}$ and modulation ratio $R_{mod}$ provided by circuit 35 are referenced to signal $CK_{ref}$. The test method according to the previously-described embodiment enables to take into account the low-frequency jitter of signal $CK_{ref}$.

FIG. 10 shows, in timing diagrams, the reference clock signal $CK_{ref}$ used by circuit 35 which comprises a jitter, and a reference signal $CK''_{ref}$ at the same frequency as signal $CK_{ref}$ and comprising no jitter. The real operating time window Window corresponds to a determined number of cycles of signal $CK_{ref}$. Theoretical operating window Window' corresponds to the same determined number of cycles of signal $CK''_{ref}$. Due to the jitter, window Window' may be greater or smaller than window Window. The applicant has shown that the jitter which affects signal $CK_{ref}$ substantially corresponds to a low-frequency jitter which has a deterministic behavior. This means that the low-frequency jitter of signal $CK_{ref}$ can be characterized by the difference between window Window and window Window'. Call correction factor Corr the ratio between window Window' and window Window. The corrected modulation period $T_{mod}$ is equal to the product of modulation period $T_{mod}$ by correction factor Corr and the corrected modulation ratio $R''_{mod}$ is equal to the product of modulation factor $R_{mod}$ by correction factor Corr. Operating time window Window may be obtained from signal Win_open.

Of course, embodiments are likely to have various alterations and modifications which will occur to those skilled in the art. In particular, although the present disclosure has been described in relation with a clock signal provided by a phase-locked loop, it more generally applies whatever the source of the clock signal. For example, in some embodiments this signal is provided by a frequency synthesizer.

Further, although steep edges of the clock signals have been assumed, the triggering of the different flip-flops in practice depends on their structures and on their characteristics in terms of set-up time and of hold time necessary to record the state. This however makes no change for the above-discussed operation.

Further, the implementation of embodiments is within the abilities of those skilled in the art based on the functional indications given hereabove according to the application, especially as concerns the setting of the number of bits of the reference pattern, of the measurement frequency, and of the detection threshold. The number of bits forming the word to be compared with the reference pattern may moreover comprise all or part of the outputs of the shift register.

Such alterations, modifications, and improvements are intended to be part of this disclosure, and are intended to be within the spirit and the scope of the present disclosure. Accordingly, the foregoing description is by way of example only and is not intended to be limiting.

According to one embodiment there is provided a computer readable medium comprising a computer program adapted to perform one or more of the methods described above. The medium may be a physical storage medium such as a Read Only Memory (ROM) chip, or a disk such as a Digital Versatile Disk (DVD-ROM) or Compact Disk (CD-ROM). In one embodiment, an electronic signal over wires, an optical signal or a radio signal such as to a satellite or the like may be used to cause a computing device to perform one or more of the methods described above. The disclosure also extends to a processor running the software or code, e.g., a computer configured to carry out one or more of the methods described above.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
estimating parameters of a spreading system to spread a spectrum of a periodic first signal according to a modulation period, the estimating including:
sampling the periodic first signal using a periodic second signal;
determining, based on the sampling, each occurrence where the periodic first signal and the periodic second signal are synchronous;
incrementing a first counter at each sampling;
resetting the first counter at each said occurrence;
storing at each said occurrence a last value of the first counter before resetting the first counter;
providing a periodic third signal at a first level when said last value is greater than a threshold and at a second level when said last value is smaller than the threshold; and
determining the modulation period based on a period of the periodic third signal.

2. The method of claim 1 wherein the spreading system is further defined by a modulation ratio, and the method further comprises:
incrementing a second counter at each said occurrence;
incrementing a third counter at each said occurrence according to a comparison of said last value with the threshold; and
determining the modulation ratio based on a ratio of counts of the third counter to the second counters.

3. The method of claim 2, further comprising:
determining a first time period corresponding to a determined number of cycles of the periodic second signal;
determining a second time period corresponding to a determined number of cycles of a periodic fourth signal at a same frequency as the periodic second signal and having no jitter; and
correcting the modulation period and the modulation ratio based on a ratio of the second time period to the first time period.

4. The method of claim 1, further comprising:
providing a result of the sampling to an input of a shift register triggered by the periodic second signal;
determining a first quantity corresponding to a number of bits of a current word formed from parallel outputs of the shift register in a first state and a second quantity corresponding to a number of bits of the current word in a second state; and
counting a number of occurrences of an equality of the first and second quantities.

5. The method of claim 1, further comprising:
providing a result of the sampling at an input of a shift register triggered by the periodic second signal;
comparing at least first states and last states of a current word formed from parallel outputs of the shift register with respect to at least one reference word; and
counting a number of occurrences of the reference word.

6. The method of claim 5 wherein first and last bits of the reference word are in inverse states.

7. The method of claim 5 wherein the reference word comprises first and second bit halves, each comprising a same number of bits in a first state and a same number of bits in a second state.

8. The method of claim 5 wherein a number of bits of the reference word ranges between four and twelve.

9. A device to estimate parameters of a system to spread a spectrum of a periodic first signal according to a modulation period, comprising:
a shift register having an input configured to receive the periodic first signal, sampled by a periodic second signal;
a first circuit configured to determine based on the sampling, each occurrence where the periodic first signal and the periodic second signal are synchronous;

a first counter configured to count each sampling and to reset at each said occurrence;

a memory configured to store a last value of the first counter before the resetting of the first counter at each said occurrence;

a second circuit configured to generate a third binary signal at a first level when said last value is greater than a threshold and at a second level when said last value is smaller than the threshold; and a third circuit configured to determine the modulation period based on a period of the third signal.

10. The device of claim 9 wherein the spreading system is further defined by a modulation ratio, and further comprising:

a second counter configured to count each said occurrence;

a third counter configured to count each said occurrence when said last value is greater or smaller than the threshold; and a fourth circuit configured to determine the modulation ratio based on a ratio of counts of the third counter to the counts of the second counter.

11. A system, comprising:

means for generating a spread spectrum clock signal; and means for estimating a modulation period of the spread spectrum clock signal, the means for estimating having:

means for sampling the spread spectrum clock signal using a sampling clock signal;

means for tracking occurrences of synchronization between the spread spectrum clock signal and the sampling clock signal; and means for generating a binary signal based on the tracking of occurrences of synchronization.

12. The system of claim 11 wherein the means for sampling comprises a shift register.

13. The system of claim 12 wherein the means for tracking comprises a pattern detector.

14. The system of claim 13 wherein the means for tracking comprises a counter.

15. The system of claim 11 wherein the means for generating a binary signal comprises a comparator.

16. The system of claim 11, further comprising means for estimating a modulation ratio of the spread spectrum clock signal.

17. A system, comprising:

a spread spectrum clock generator configured to generate a spread spectrum clock signal; and a modulation period estimator having:

a sampler configured to sample the spread spectrum clock signal using a sampling signal;

a synchronization detector configured to detect occurrences of synchronization between the spread spectrum clock signal and the sampling signal; and a modulation period detector configured to estimate a modulation period of the spread spectrum clock signal based on the detected occurrences.

18. The system of claim 17 wherein the sampler comprises a plurality of flip-flops.

19. The system of claim 17 wherein the synchronization detector comprises a shift register and a pattern detector.

20. The system of claim 19 wherein the modulation period detector comprises:

a sampling counter configured to count cycles of the sampling clock;

a memory configured to store an output of the sampling counter; and a comparator configured to compare the stored output of the sampling counter to a threshold and generate a signal indicative of the modulation period based on the comparison.

21. The system of claim 20 wherein the modulation period detector further comprises a counter configured to count transitions of the signal indicative of the modulation period from a low state to a high state.

22. The system of claim 20, further comprising:

a modulation ratio estimator configured to estimate a modulation ratio of the spread spectrum clock signal.

23. The system of claim 22 wherein the modulation ratio estimator comprises:

a synchronization occurrence counter configured to count the detected occurrences of synchronization;

a threshold counter configured to count occurrences of the stored output of the sampling counter being less than the threshold; and a divider coupled to the synchronization occurrence counter and to the threshold counter.

24. The system of claim 17 wherein the modulation period estimator is configured to compensate for jitter in the sampling signal.

25. A method, comprising:

estimating a modulation period of a spread spectrum clock signal in an electronic device, the estimating including:

sampling the spread spectrum clock signal with a sampling clock signal;

tracking occurrences of synchronization between the spread spectrum clock signal and the sampling clock signal;

generating a periodic signal based on the tracking of occurrences of synchronization; and estimating the modulation period based on a period of the generated periodic signal.

26. The method of claim 25 wherein, the tracking the occurrences of synchronization comprises counting the occurrences of synchronization; and the method comprises estimating a modulation ratio of the spread spectrum signal based on the counting of the occurrences of synchronization.

\* \* \* \* \*

UNITED STATES PATENT AND TRADEMARK OFFICE
CERTIFICATE OF CORRECTION

PATENT NO. : 8,995,496 B2  Page 1 of 1
APPLICATION NO. : 13/085341
DATED : March 31, 2015
INVENTOR(S) : Hervé Le-Gall It is certified that error appears in the above-identified patent and that said Letters Patent is hereby corrected as shown below:

On the Title Page
Item (73):
"STMicroelectronics SAS, Grenoble (FR)" should read, --STMicroelectronics (Grenoble 2) SAS, Grenoble (FR)--.

In the Claims
Column 10, Line 23:
"of the third counter to the second counters." should read, --of the third counter to the second counter.--.

Signed and Sealed this
Eighth Day of September, 2015

Michelle K. Lee
*Director of the United States Patent and Trademark Office*